United States Patent
Lan et al.

(10) Patent No.: US 6,960,783 B2
(45) Date of Patent: Nov. 1, 2005

(54) ERASING AND PROGRAMMING AN ORGANIC MEMORY DEVICE AND METHOD OF FABRICATING

(75) Inventors: Zhida Lan, Cupertino, CA (US); Colin Bill, Cupertino, CA (US); Michael A. VanBuskirk, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/436,786

(22) Filed: May 13, 2003

(65) Prior Publication Data

US 2004/0227136 A1 Nov. 18, 2004

(51) Int. Cl.$^7$ .............................................. H01L 35/24
(52) U.S. Cl. ............................ 257/40; 257/40; 257/481; 438/584; 438/624; 438/627; 438/597; 438/257; 438/652; 438/653; 438/674; 438/780
(58) Field of Search ..................... 257/40, 481; 438/584, 438/624, 627, 597, 257, 652, 653, 674, 780

(56) References Cited

U.S. PATENT DOCUMENTS

| | | | |
|---|---|---|---|
| 3,833,894 A | | 9/1974 | Aviram et al. |
| 5,272,359 A | | 12/1993 | Nagasubramanian et al. |
| 6,055,180 A | | 4/2000 | Gudesen et al. |
| 6,686,263 B1 | * | 2/2004 | Lopatin et al. ............. 438/584 |
| 6,746,971 B1 | * | 6/2004 | Ngo et al. ................... 438/780 |
| 2004/0084670 A1 | * | 5/2004 | Tripsas et al. |

FOREIGN PATENT DOCUMENTS

WO   WO 2004/048637 A1   6/2004

OTHER PUBLICATIONS

International Search Report, PCT/US2004/011811, mailed Sep. 14, 2004.
Patent Abstracts of Japan, Sep. 7, 1992, vol. 0164, No. 23 (E–1260), and JP 4 145664 A (Canon, Inc.).

* cited by examiner

*Primary Examiner*—David Nelms
*Assistant Examiner*—Mai-Huong Tran
(74) *Attorney, Agent, or Firm*—Amin & Turocy, LLP

(57) ABSTRACT

An organic memory cell made of two electrodes with a selectively conductive media between the two electrodes is disclosed. The selectively conductive media contains an organic layer and passive layer. The selectively conductive media is programmed by applying bias voltages that program a desired impedance state for a memory cell. The desired impedance state represents one or more bits of information and the memory cell does not require constant power or refresh cycles to maintain the desired impedance state. Furthermore, the selectively conductive media is read by applying a current and reading the impedance of the media in order to determine the impedance state of the memory cell. Methods of making the organic memory devices/cells, methods of using the organic memory devices/cells, and devices such as computers containing the organic memory devices/cells are also disclosed.

23 Claims, 15 Drawing Sheets

ERASING AND PROGRAMMING AN ORGANIC MEMORY DEVICE AND METHOD OF FABRICATING

FIELD OF INVENTION

The present invention relates generally to organic memory devices and, in particular, to erasing, programming, fabricating and utilizing organic memory devices containing an organic polymer.

BACKGROUND OF THE INVENTION

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, . . . ).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Thus, further device shrinking and density increasing may be limited for inorganic memory devices. Furthermore, such device shrinkage for inorganic non-volatile memory devices while meeting increased performance demands is particularly difficult, especially while maintaining low costs.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

Systems and methods are provided for fabricating organic memory devices and employing organic memory devices. The organic memory devices utilize an organic conductor that facilitates migration of charge (e.g., electrons, holes). The present invention provides organic memory devices that possess at least one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

An organic memory cell comprised of two electrodes with a selectively conductive media between the two electrodes is disclosed. The selectively conductive media contains an organic conductor layer and one or more passive layers. The selectively conductive media is programmed (e.g., written) by applying bias voltages that programs a desired impedance state into the memory cell. The desired impedance state represents one or more bits of information and does not require a constant power supply or refresh cycles to maintain the desired impedance state. The impedance state of the selectively conductive media is read by applying a current and then reading the impedance of the selectively conductive media. As with the written impedance state, the read impedance state represents one or more bits of information. Additionally, methods of fabricating the organic memory devices/cells, methods of using the organic memory devices/cells, and devices such as computers containing the organic memory devices/cells are also disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
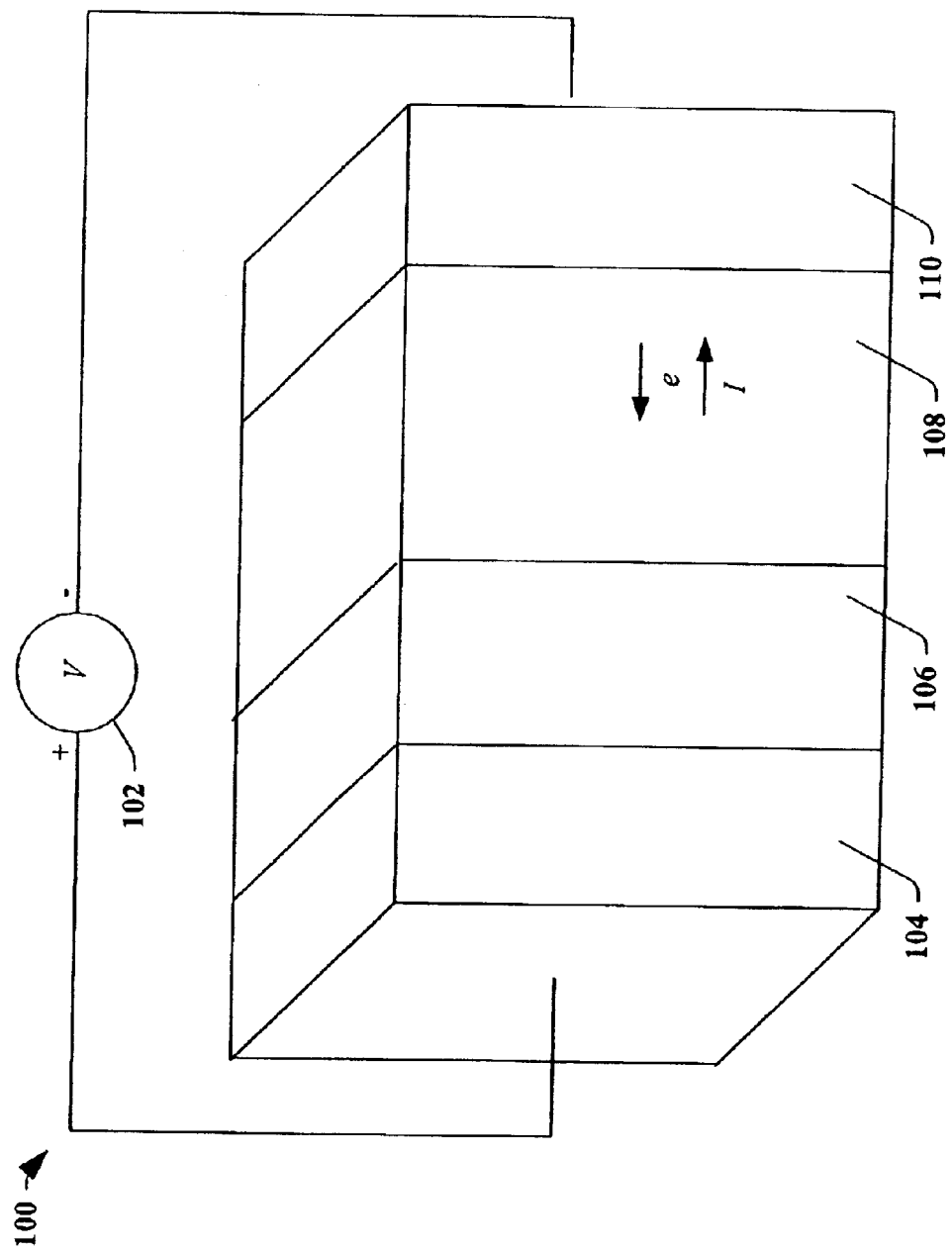
FIG. 1 is a 3-D diagram of an organic memory device in accordance with an aspect of the present invention.

The following is a detailed description of the present invention made in conjunction with the attached figures, wherein like reference numerals will refer to like elements throughout.

The present invention provides an organic memory device that can operate as a non-volatile memory device. The cells of the organic memory device are operative to be of two or more states corresponding to various levels of impedance. These states are set by applying a bias voltage and then the cells remain in their respective states until another voltage, in reverse bias, is applied. The cells maintain their states with or without power (e.g., non-volatile) and can be read either electrically or optically by measuring injection current or light emission. The organic memory device of the present invention facilitates increases in device density whilst also increasing device performance relative to conventional inorganic memory device.

Additionally, the organic memory device of the present invention employs electronic stimulation (e.g., flow of electrons and holes) instead of ions and/or electric fields. Thus, the organic memory device can have better performance and/or a quicker response to changes in stimuli as compared to other types of memory devices.

Referring to FIG. 1, a 3-D diagram of an organic memory device in accordance with an aspect of the present invention is depicted. The memory device includes a first electrode 104, a passive layer 106, an organic polymer layer 108, and a second electrode 110. The diagram also illustrates a voltage source 102 connected to the first electrode 104 and the second electrode 110 that applies a voltage on the first electrode 104 and the second electrode 110.

The first electrode 104 and the second electrode 110 are comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the first electrode 104 and the second electrode 110 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 108 and the passive layer 106 are collectively referred to as a selectively conductive media or selectively conductive layer. The conductive properties of this media (e.g., conductive, non-conductive, semi-conductive) can be modified in a controlled manner by applying various voltages across the media via the electrodes 104 and 110.

The organic layer 108 is comprised of a conjugated organic material, such as a small organic molecule and a conjugated polymer. If the organic layer is polymer, a polymer backbone of the conjugated organic polymer may extend lengthwise between the electrodes 104 and 110 (e.g., generally substantially perpendicular to the inner, facing surfaces of the electrodes 104 and 110). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt). A more detailed discussion of the composition of the organic layer 108 is described infra.

The organic layer 108 has a suitable thickness that depends upon the chosen implementations and/or the memory device being fabricated. Some suitable exemplary ranges of thickness for the organic polymer layer 108 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic layer 108 can be formed via a number of suitable techniques. One suitable technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometime it may have a chemical bond formed between the conjugated organic polymer and the passive layer 106.

The passive layer 106 contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 108. The particular conductivity facilitating compound employed is selected so that the two relatively stable states match with the two relatively stable states of the conjugated organic molecule of the layer 108.

The passive layer 106 is operative to transport charge from the first electrode 104 to the interface between the organic layer 108 and the passive layer 106. Additionally, the passive layer 106 facilitates charge carrier (e.g., electrons or holes) injection into the organic layer 108 and increases the concentration of the charge carrier in the organic layer resulting in a modification of the conductivity of the organic layer 108. Furthermore, the passive layer 106 can also store opposite charges in the passive layer 106 in order to balance the total charge of the device 100.

The passive layer 106 can in some instances act as a catalyst when forming the organic layer 108. In this connection, the backbone of the conjugated organic molecule may initially form adjacent the passive layer 106, and grow or assemble away and substantially perpendicular to the passive layer surface. As a result, the backbones of the conjugated organic molecule may be self aligned in a direction that traverses the two electrodes.

Examples of conductivity facilitating compounds that may make up the passive layer 106 include one or more of copper sulfide ($CU_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), , iron oxide ($Fe_3O_4$), and the like. The passive layer 106 may be grown using oxidation techniques, formed via gas phase reactions, or deposited between the electrodes.

The passive layer 106 has a suitable thickness that can vary based on the implementation and/or memory device being fabricated. Some examples of suitable thicknesses for the passive layer 106 are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

In order to facilitate operation of the organic memory device, the organic layer 108 is generally thicker than the passive layer 106. In one aspect, the thickness of the organic layer is from about 0.1 to about 500 times greater than the thickness of the passive layer. It is appreciated that other suitable ratios can be employed in accordance with the present invention.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 110 through the selectively conductive media to the first electrode 104 based on a voltage applied to the electrodes by the voltage source 102 if the organic layer is n-type conductor. Alternately, holes flow from the first electrode 104 to second electrode 110 if the organic layer 108 is p-type conductor, or both electrons and holes flow in the organic layer if it can be both n and p type with proper energy band match with 106 and 110. As such, current flows from the first electrode 104 to the second electrode 110 via the selectively conductive media.

Switching the organic memory device to a particular state is referred to as programming or writing. Programming is accomplished by applying a particular voltage (e.g., 9 volts, 2 volts, 1 volts, . . . ) across the selectively conductive media via the electrodes 104 and 110. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on". . . ). The threshold value varies depending upon a number of factors including the identity of the materials that constitute the organic memory device, the thickness of the various layers, and the like. The voltage supply 102 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 2 volts, 1 volts, 0.5 volts) is applied via the voltage source 102. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

Figure 2:
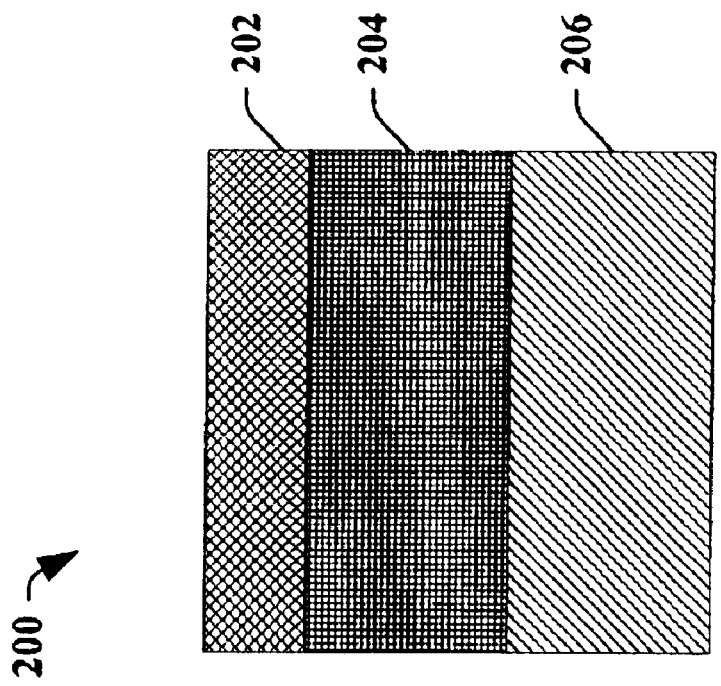
FIG. 2 is a block diagram of a passive layer that can be employed in an organic memory device in accordance with an aspect of the present invention.

FIG. 2 is a block diagram that depicts fabrication of a passive layer 200 in accordance with an aspect of the present invention. A $Cu_yS$ layer is formed by a gas phase reaction operation. A first layer 206 is formed that comprises Cu. A second layer 204 is formed on the first layer. The second layer comprises $Cu_yS$ (e.g., $Cu_2S$, CuS or mixture thereof) and has a thickness of about 20 Å or more. A third layer 202 is formed on the second layer 204. The third layer 202 contains $Cu_2O$, and/or CuO and generally has a thickness of about 10 Å or less. It is appreciated that alternate aspects of the invention can employ suitable variations in composition and thickness and still be in accordance with the present invention.

Figure 3:
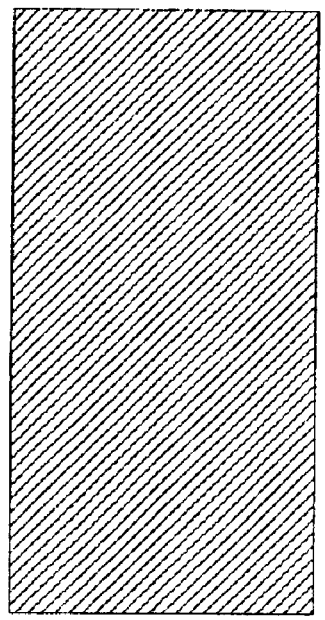
FIG. 3 is a block diagram illustrating an organic polymer layer formed by a CVD process in accordance with an aspect of the present invention.

FIG. 3 is a block diagram illustrating an organic layer 300 formed by a chemical vapor deposition (CVD) process in accordance with an aspect of the present invention. The organic layer 300 is formed via a gas phase reaction process. Typically, the organic layer 300 is formed in contact with a passive layer and an electrode. The organic layer 300 is comprised of polymer polydiphenylacetylene (DPA). This polymer layer, as shown in FIG. 3, is fabricated to be about 65 Å thick.

Figure 5:
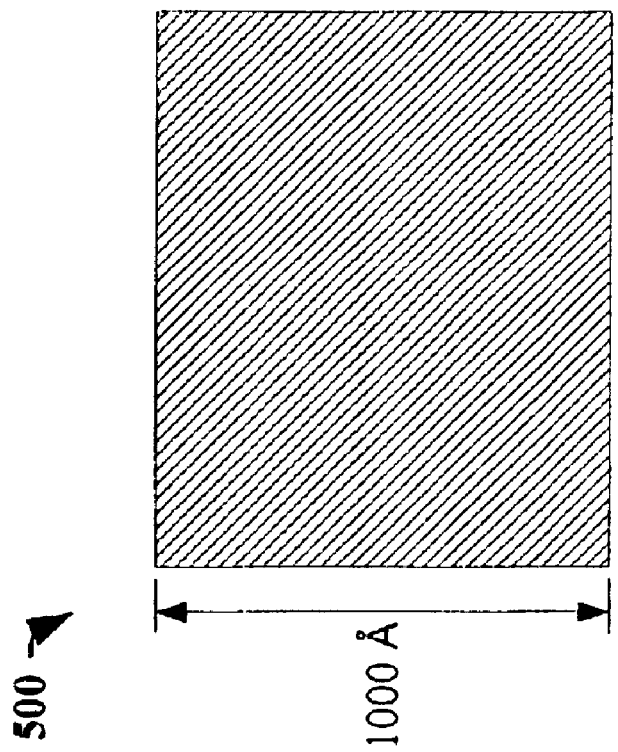
FIG. 5 is a block diagram of yet another organic polymer layer formed by a CVD process in accordance with an aspect of the present invention.
Figure 4:
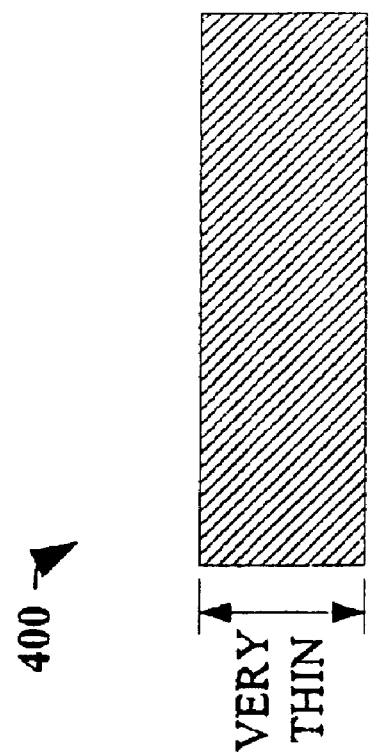
FIG. 4 is a block diagram illustrating another organic polymer layer formed by a CVD process in accordance with an aspect of the present invention.

Turning now to FIG. 4, a block diagram depicting another organic layer 400 formed from a CVD process in accordance with an aspect of the present invention is illustrated. Once again, the organic layer 402 is formed via a gas phase reaction process. The organic layer 402 is formed in contact with a passive layer and an electrode. The organic polymer layer 402 is comprised of polymer polyphenylacetylene (PPA). Referring to FIG. 5, a block diagram of another organic layer 500 formed by spin coating in accordance with an aspect of the present invention is illustrated. The organic layer 500 is formed via a spin coating process, instead of a gas phase reaction process. The organic layer 500 is formed in contact with a passive layer and an electrode. The organic layer 500 is comprised substantially of PPA and has a thickness of about 1000 Å.

Experimental results tend to show that organic layers formed via spin coating yield a more reliable polymer layer than polymer layers formed via CVD. This may be due to the presence of oxygen and lack of control of heat generated by polymerization under CVD. It is appreciated that controlling heat and oxygen during polymerization for CVD processes can improve the resulting polymer layer. Additionally, organic layers created via CVD are generally thinner than those created with other methods.

It is appreciated that various alternatives to and variations of the layers described in FIGS. 2–5 can be employed in accordance with the present invention.

The passive layer (e.g., CuS) employed in organic memory devices play an important role. Its presence significantly improves the conductivity of the organic layer. This characteristic is at least partially a function of the following: charge carrier generated by CuS, build up of a charge depletion layer, charge carrier distribution in organic material, and memory loss due to charge carrier redistribution after reversing electric field. The discussion infra describes and illustrates charge carrier concentration and models behavior of organic memory devices.

In the following example, conductive polymer is used as organic material, and CuS is used as passive layer material. With respect to charge carrier generation, the copper in CuS is at its highest oxidation state Cu(II). It has relatively strong capability to gain electrons from a contacting polymer and yields the following equation:

$$Cu(II)S + Polymer \rightarrow Cu(I)S^- + Polymer^+ \quad (1)$$

Figure 6:
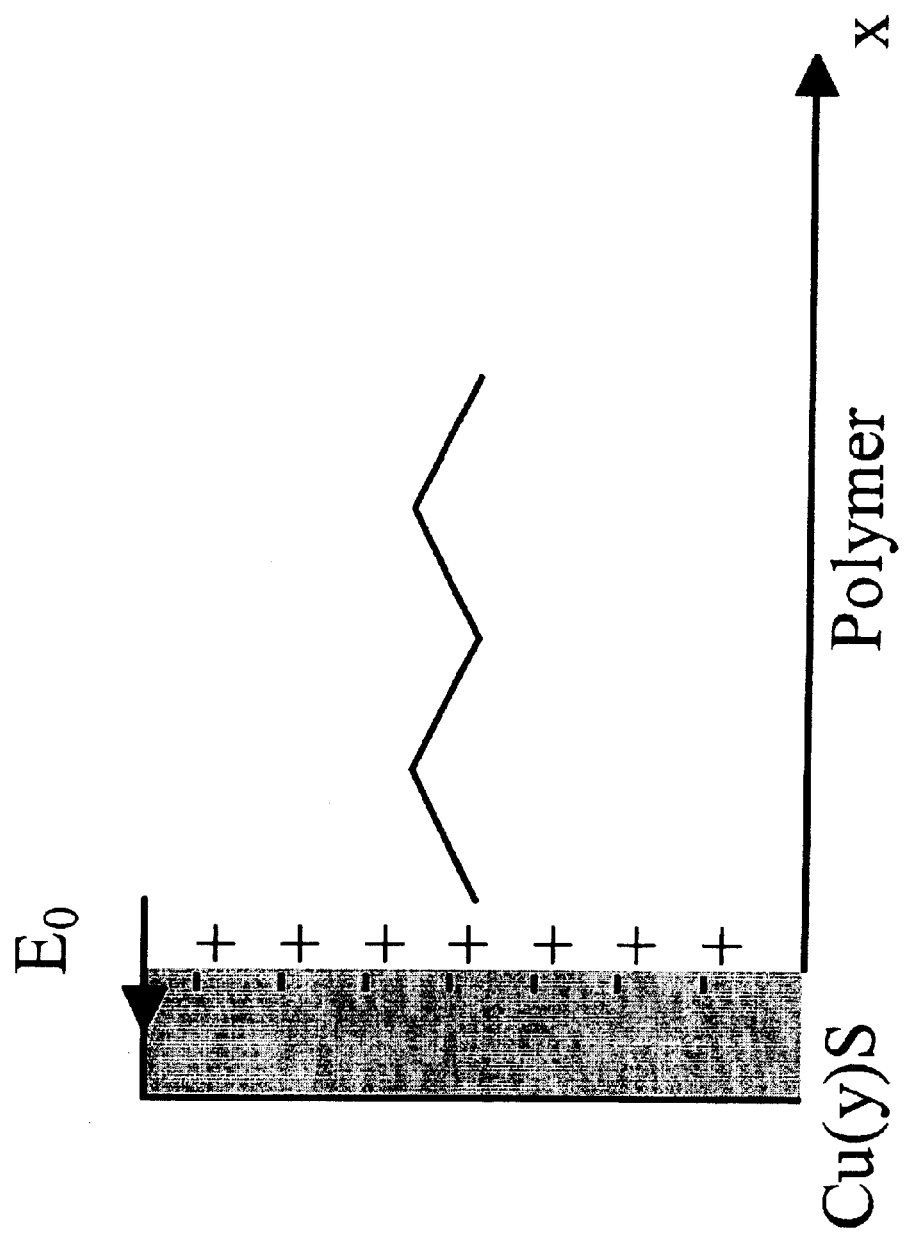
FIG. 6 is a graph depicting the effect of an intrinsic electric field on an interface between a passive layer and an organic polymer layer in accordance with an aspect of the present invention.

The consequence is that an intrinsic field is produced due to the charges accumulated on the interface between CuS and polymer. This is shown in FIG. 6, which is a graph depicting the effect of an intrinsic electric field on an interface between Cu(y)S and a polymer is provided. The oxidized polymer (Polymer$^+$) is the charge carrier when external field is applied. The conductivity of polymer is determined by its concentration and its mobility.

$$\sigma = qp\mu \quad (2)$$

Where q is the charge of the carrier, p is carrier concentration and p is the mobility.

Referring now to the charge depletion layer, employing a similar concept as applied with respect to semiconductors, a potential function can be expressed as:

$$V(x) = qN_p(d_p x - x^2/2)/\epsilon \quad (3)$$

where $N_p$ is the average concentration of charge carrier, $\epsilon$ is the dielectric constant of the polymer, and $d_p$ is the width of the charge depletion. $N_p$ can be obtained by employing the following equation:

$$d_p = \left[\frac{2\epsilon(V_b \pm V)}{qN_p}\right]^{1/2} \quad (4)$$

where V is the external field voltage applied. For forward voltage, it is "−" sign. For the reverse voltage, it is "+" sign. The voltage function of Eq. (3) can be approximated to simplify the derivation.

With respect to charge carrier distribution, like p-doping of a semiconductor, two processes typically take place in the electric field. This flux can be expressed as:

$$J = -qD\frac{dp}{dx} + q\mu p E \quad (5)$$

where D is diffusion constant of the charge carrier, and E is the electric field at x. If there is no current, the carrier distribution is:

$$p(x) = p(0)\exp([(V(0)-V(x))/Vt]) \quad (6)$$

where p(0) is the concentration, V(0) is voltage at the interface respectively, and $V_t = kT/q$.

When forward voltage is so large that the current flux J>0, the analytical equation can be derived for steady state flow with some assumption for the voltage distribution in the cell. Overall, under forward voltage, the charge distribution p(x) is an increase function of x. When reverse voltage is applied, $V(x) > V_0$, the charge concentration is a decrease function of x.

The final characteristic, retention time, refers to the fact that a forward voltage produces more charge carrier and the charge carrier accumulates more on the other end of the passive (CuS) layer (away from the organic polymer). However, this charge carrier concentration will be set back once the voltage is removed, which includes two processes: charge carrier diffusion toward the CuS layer and charge carrier recombination on the interface.

Fick's Law can describe the 1st process, charge carrier diffusion toward the CuS layer.

The charge carrier recombination can be described as follows:

$$Cu(I)S^- + Polymer^+ \rightarrow Cu(II)S + Polymer \quad (7)$$

The retention time is the time required to redistribute the charge carrier to the original state. It is likely that the reaction rate is relatively faster than diffusion rate. Therefore, the retention time can be substantially determined by the diffusion process only.

An exemplary memory cell is considered herein with respect to the equations 1–9 discussed supra and illustrated in FIG. 7–12. The exemplary cell is considered with parameters intrinsic voltage $V_b = 0.02V$, equilibrium constant $K_{eq} = 2.17 \times 10^{-4}$, concentration of CuS and Polymer at interface $[Polymer]_0 = [CuS]_0 = 10^{23}/cm^3$, polymer thickness $d = 5 \times 10^{-5}$ cm (0.5 um), and CuS thickness $d_{CuS} = 5 \times 10^{-7\,cm}$ (0.005 um). Six typical cases are calculated to illustrate electrical operation of an organic memory device in accordance with an aspect of the present invention.

Figure 7:
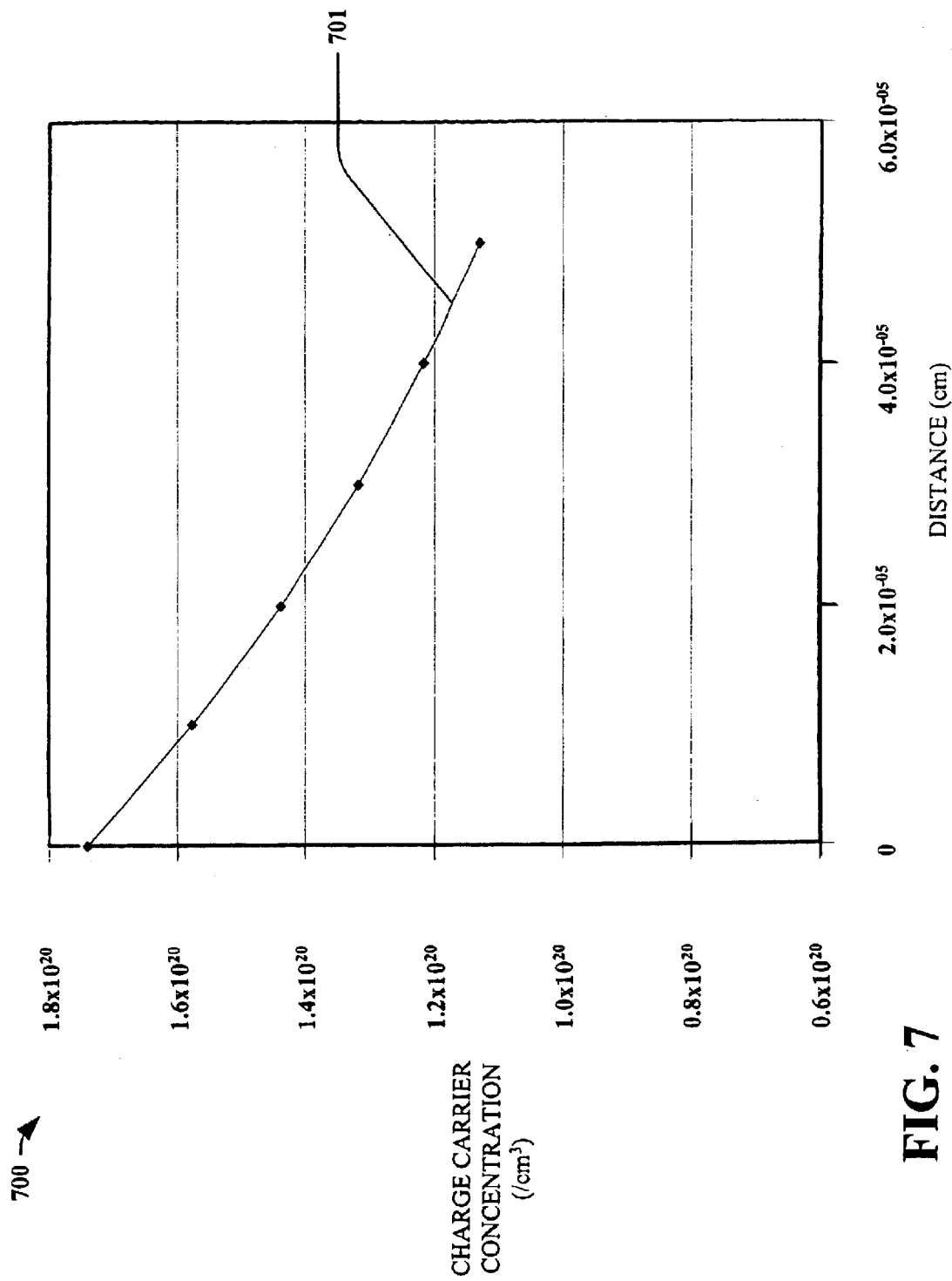
FIG. 7 is a graph illustrating charge carrier distribution of an exemplary memory cell in accordance with an aspect of the present invention.

FIG. 7 depicts a graph 700 of charge carrier distribution 701 of the exemplary memory cell as a function of distance from the CuS and organic polymer interface in accordance with an aspect of the invention. The charge carrier concentration 701 is shown as being a decreasing function of distance (x) from the interface. This graph 700 assumes an external voltage V=0 and a current J=0. The charge carrier concentration 701 is derived utilizing Eq. 6 with a constant field assumption. However, the points shown are independent of the constant field assumption.

Figure 8:
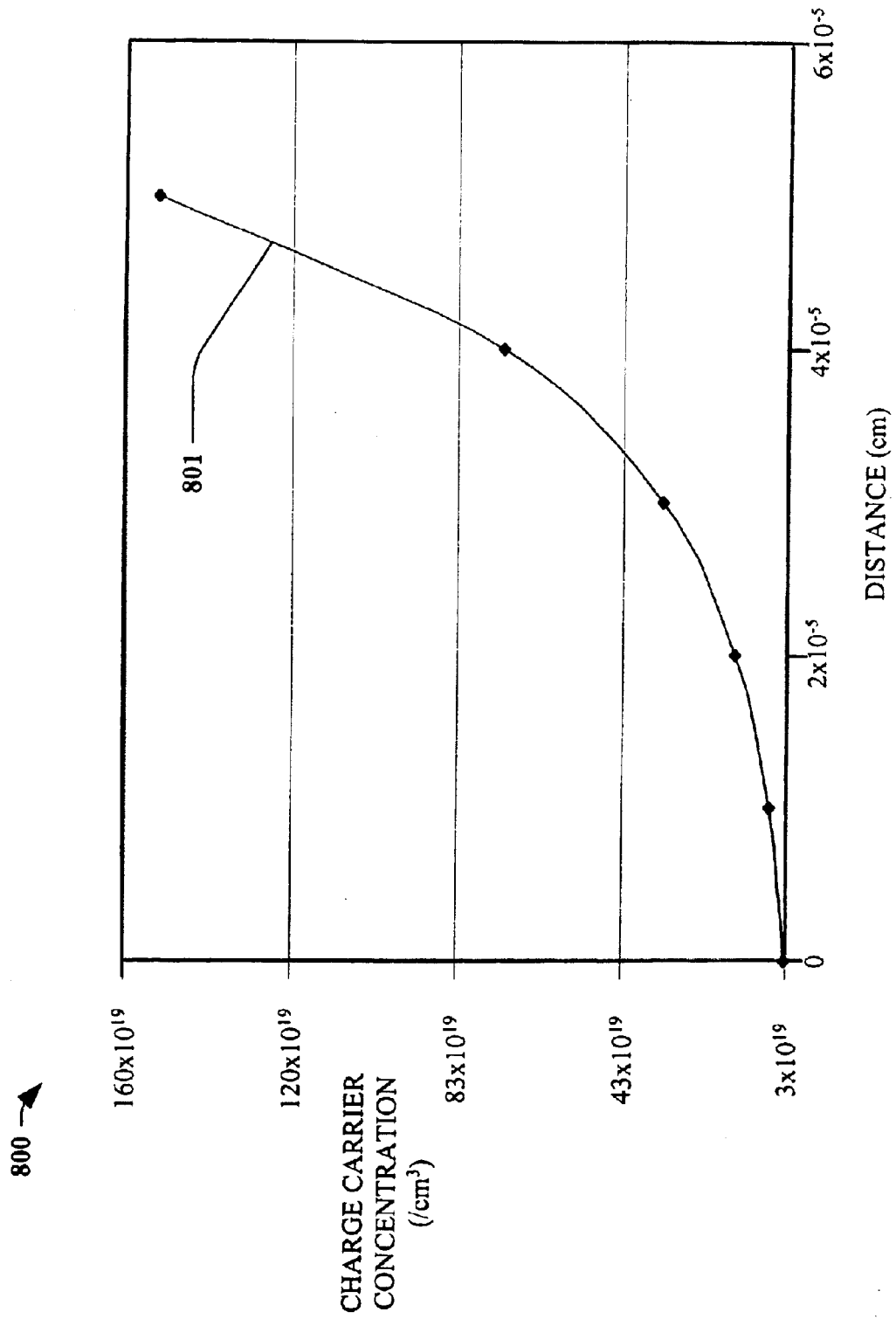
FIG. 8 is a graph illustrating charge carrier distribution of an exemplary memory cell in accordance with an aspect of the present invention.

Turning now to FIG. 8, another graph 800 illustrating charge carrier distribution 801 for the exemplary organic memory cell is depicted in accordance with an aspect of the present invention. For this graph 800, parameters are set as follows:

forward voltage=0.12V and current flux J=0. The CuS end has a higher voltage than the other end (organic polymer). This drives the charge carrier away from CuS layer and leads to charge carrier concentration that has an increase function of x. Even at lowest concentration p(0), it is not a small value for this case (e.g., its value is $3.32 \times 10^{19}/cm^3$ for the case shown in FIG. 8). This explains why the polymer is a good conductor when forward voltage is applied. Again, it is Eq. 6 with constant electric field model used for the plot. The points demonstrated are independent of constant electric field assumption.

Figure 9:
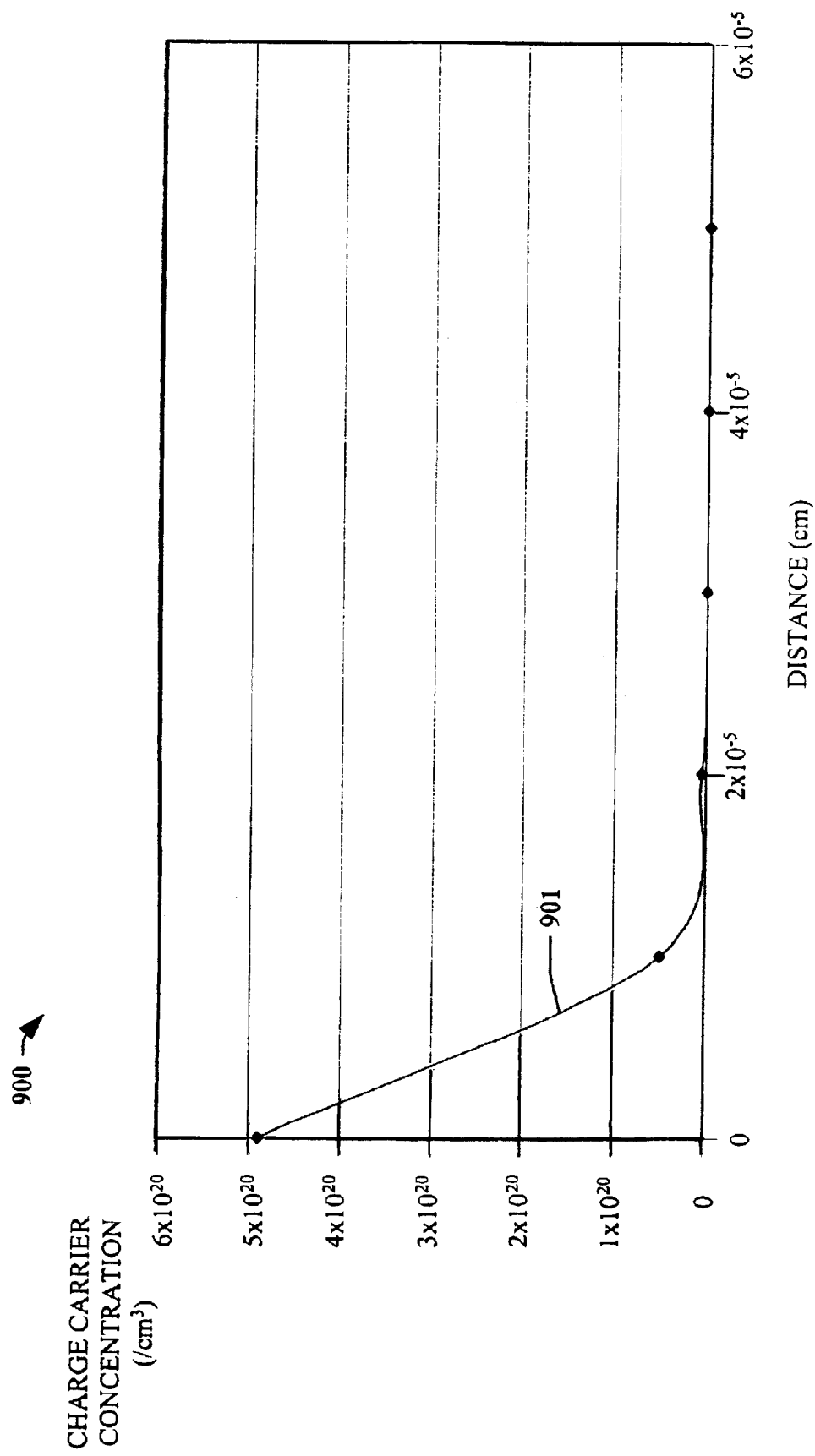
FIG. 9 is a graph illustrating charge carrier distribution of an exemplary memory cell in accordance with an aspect of the present invention.

FIG. 9 depicts yet another graph 900 of charge carrier distribution 901 of the exemplary memory cell as a function of distance from the CuS and organic polymer interface in accordance with an aspect of the invention. For this graph, the parameters are set such that the reverse voltage=0.28V and the current J=0. With reversed voltage, the charge carrier is concentrated at the CuS polymer interface and drops quickly to small concentration when it is away from the interface, which describes why the organic memory cell becomes non-conductive when high reversed voltage applied. Again, Eq. 6 with constant electric field model is assumed for the plot. The points demonstrated are independent of this assumption.

Figure 10:
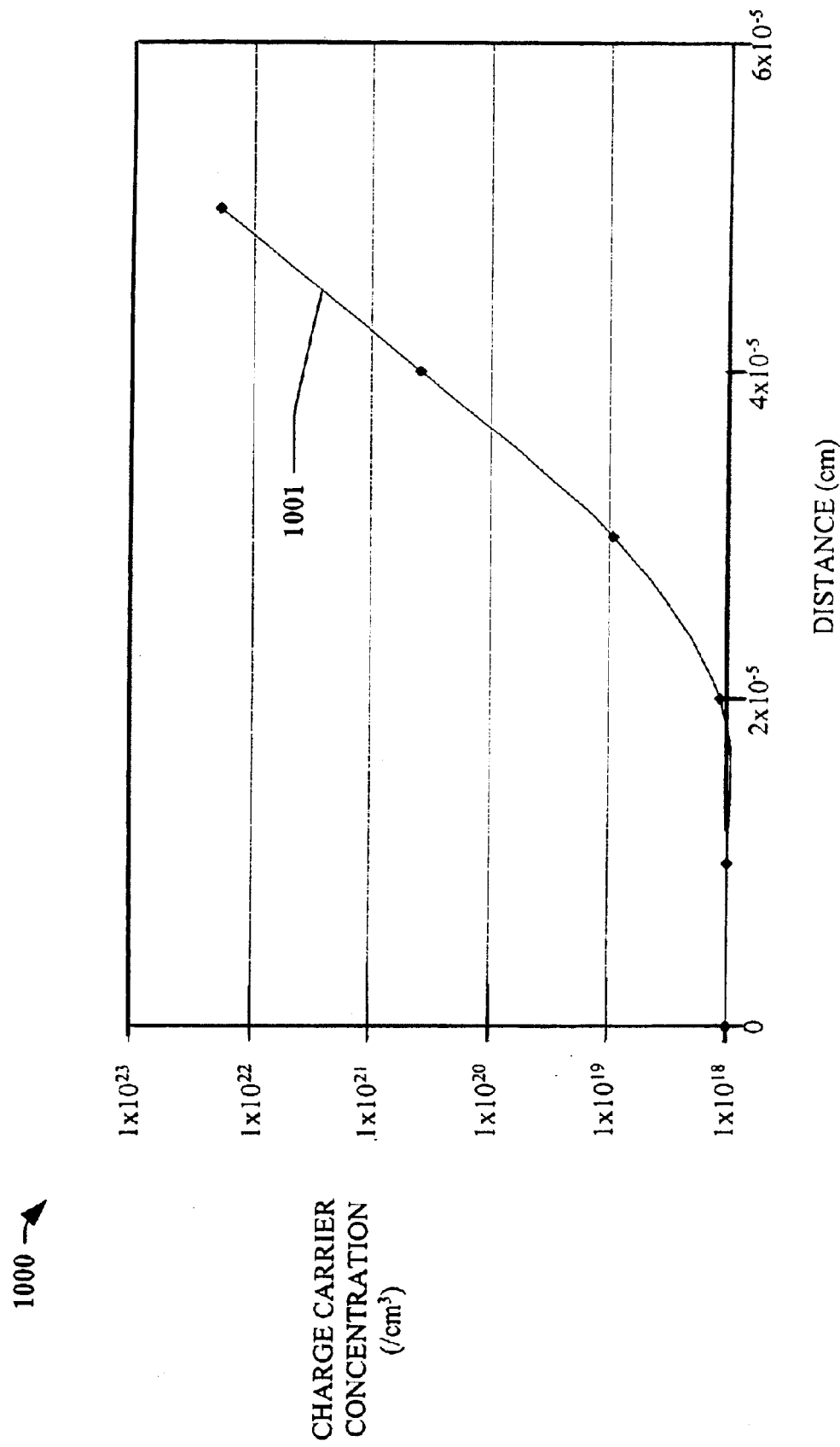
FIG. 10 is a graph illustrating charge carrier distribution of an exemplary memory cell in accordance with an aspect of the present invention.

Referring now to FIG. 10, another graph 1000 that depicts charge carrier distribution 1001 of the exemplary memory cell as a function of distance in accordance with an aspect of the present invention is provided. For this graph 1000, parameters are set as follows: forward voltage=0.52V and current flux J>0 ($p_J=10^{18}$/cm$^3$). When current flux J>0, the charge carrier is still an increase function of x because the forward voltage drives the charge carrier away from CuS interface. One important point is that the lowest concentration p(x) is at interface.

Figure 11:
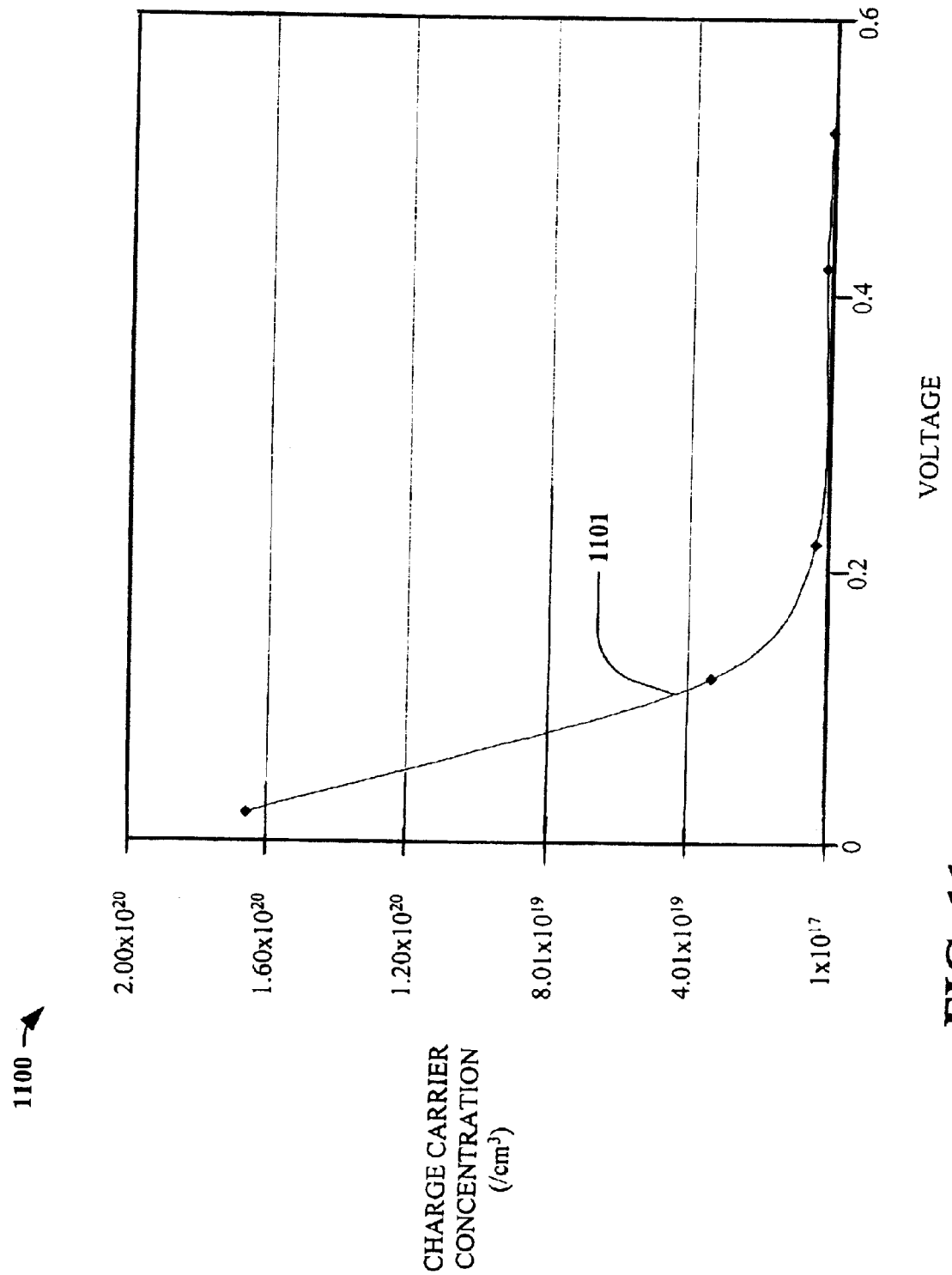
FIG. 11 is a graph illustrating charge carrier concentration at the interface of an exemplary memory cell in accordance with an aspect of the present invention.

FIG. 11 depicts yet another graph 1100 of charge carrier concentration at interface 1101 of the exemplary memory cell as function of forward voltage V. For this graph, the parameters are set such that J>0 ($p_J=10^{18/cm3}$) and assumes a constant electric field model. This model assumes the electric field in the cell is constant. Therefore, the voltage V(x) is described as a linear function. This model is applicable when the diffusion constant of the polymer is small and there is constant electric resistance. With this model, the charge carrier concentration at interface is derived as function of voltage. It is noted that $p_0(V)$ tends to be constant after forward voltage is large enough and the current is controlled by the charge carrier not charge injection at the interface. As such, p(0) can be rewritten as:

$$p(0) = \frac{1}{2}\left\{-K_{eq}[Polymer]_0 + \sqrt{(K_{eq}[Polymer]_0)^2 + \frac{4d_{CuS}K_{eq}[Polymer]_0[CuS]_0}{d}}\right\} \quad (10)$$

This Eq. 10 shows that limiting p(0) is an increase function of thickness ratio between CuS layer and polymer layer.

Figure 12:
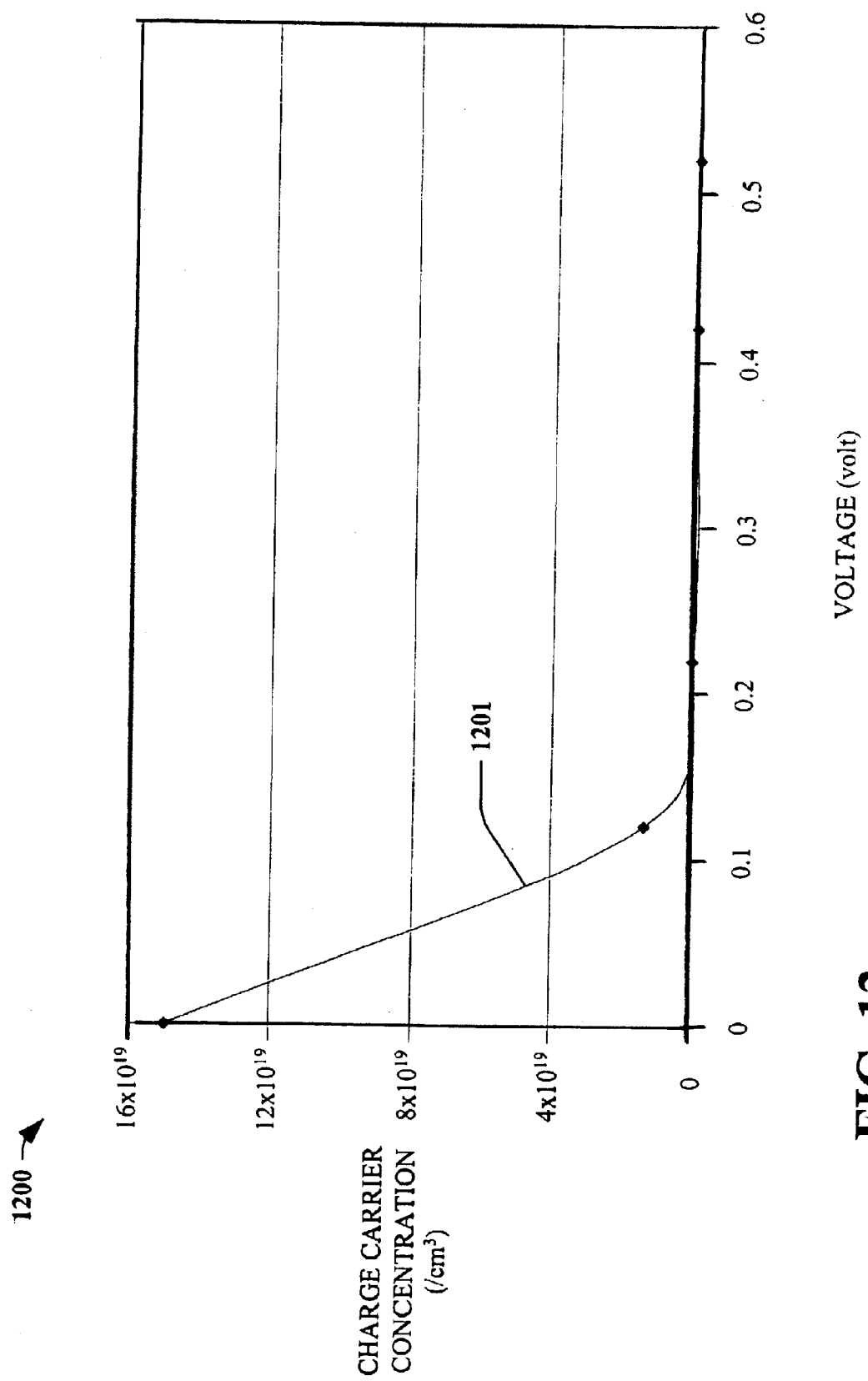
FIG. 12 is a graph illustrating charge carrier concentration at the interface of an exemplary memory cell in accordance with an aspect of the present invention.

FIG. 12 illustrates another graph 1200 that depicts charge carrier concentration at the interface 1201 of the exemplary memory cell as function of forward voltage V in accordance with an aspect of the present invention is provided. For this graph 1200, p(0) is a function of forward voltage, current J, which may or may not be >0, and a step potential function model. This model assumes the voltage V(x) function can be described by a step function. The model is applicable when the diffusion constant of the polymer is very large. Therefore, the electric resistance in the cell is trivial. With this model, the charge carrier concentration at interface is derived as the function of voltage. It is noted that in FIG. 12 that $p_0(V)$ tends to be zero after forward voltage is large enough. When the charge carrier at the interface controls the current flux, this value is a function of voltage. This zero limit behavior is due to the interface boundary limit set by the reaction (1). Basically, the fast charge carrier transportation from the interface to the other end reaches the supply limit. Thus, the limiting p(0) is also rewritten as:

$$p(0) = \frac{1}{2}\left\{-K_{eq}[Polymer]_0 + \sqrt{(K_{eq}[Polymer]_0)^2 + \frac{4d_{CuS}K_{eq}[Polymer]_0[CuS]_0}{d\left[\exp\frac{V(0)-V}{V_t} - \frac{V(0)-V}{V_t}\right]}}\right\} \quad (11)$$

Again p(0) is an increase function of thickness ratio between CuS layer and polymer layer.

Regarding the above discussion, it is important to note that the flux measured is determined by charge carrier drift when limiting flux is in the polymer. Under constant electric field assumption, the function to describe the charge carrier concentration is $p(x) \cdot p_J = p(0)$ is met when the polymer determines limiting flux since the lowest concentration in the cell is at the interface. This condition results in a constant p(x). This means the diffusion contribution to the flux in Eq. 5 is zero. Under step potential assumption, another function is employed to describe the charge carrier concentration p(x). The initial charge carrier concentration p(0) has a relatively substantially smaller value than other regions. Therefore, J is still determined by p(0). Another point that is noted regards boundary conditions. Unlike semiconductors, it is just applicable to the concentration at interface, not everywhere. This boundary condition limits the total amount of the charge carrier produced in the cell.

The equations supra (E.q. 1–7) and the FIGS. 9–12 describe and model behavior of organic memory devices. This model can be employed to explain measured data and can be for other passive layer materials aside from CuS. Additionally, the model can be used to think about how to improve retention and response time and to design the other devices such as transistor. Further, the model can be employed to develop various threshold voltages that set conductivity levels (e.g., set states), read conductivity levels and erase the conductivity levels thus performing memory device operations of writing or programming, reading and erasing.

Figure 13:
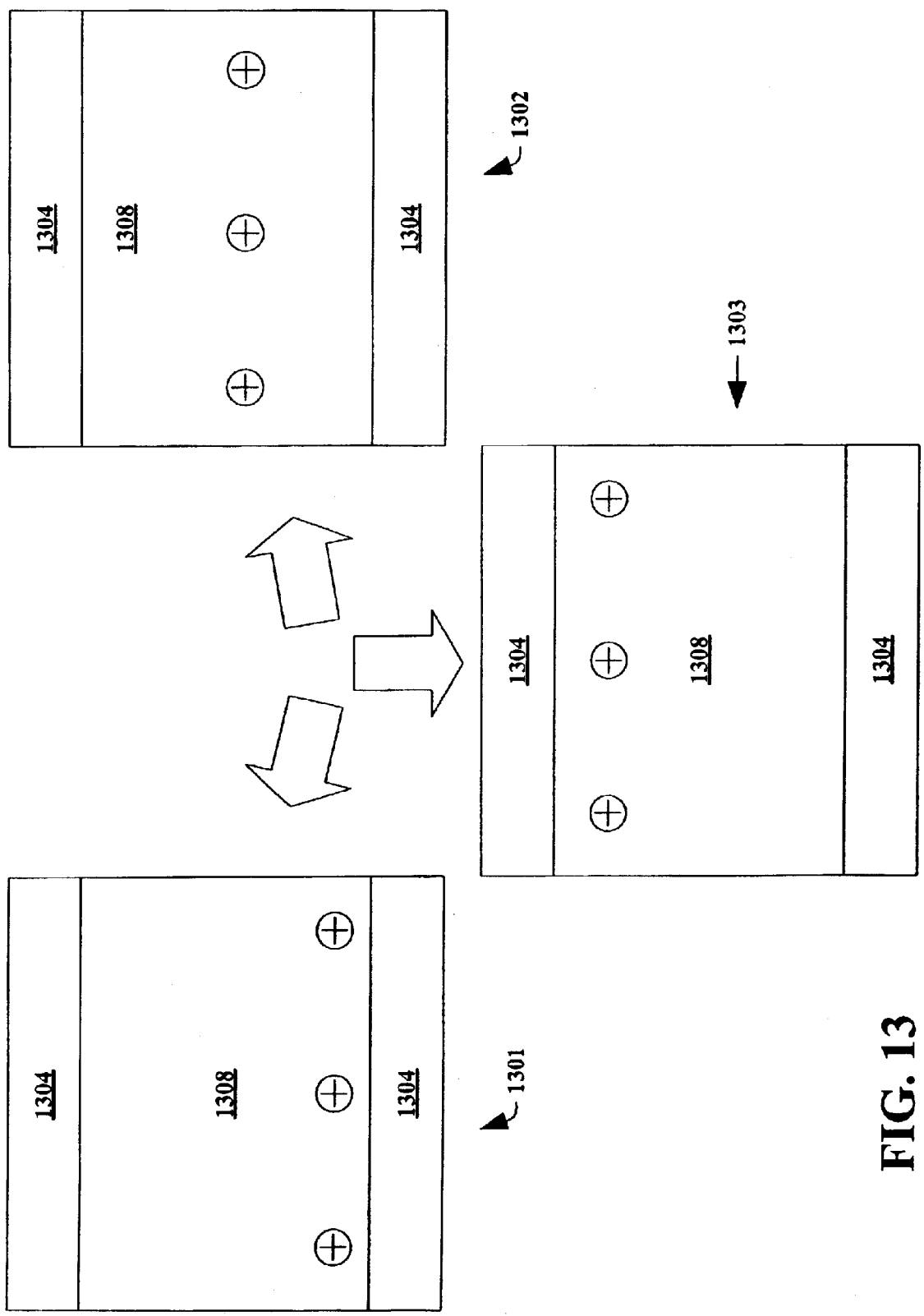
FIG. 13 is a block diagram depicting an organic memory device in various states in accordance with an aspect of the present invention.

FIG. 13 is a block diagram that illustrates an organic memory device 1300 in various states in accordance with an aspect of the present invention. The device 1300 is depicted in a first "off" state 1301, an "on" state 1302, and a second "off" state 1303. It is appreciated that memory devices formed in accordance with the present invention can have other states than those depicted in FIG. 13. The organic memory device 1300 comprises a top electrode 1304, a bottom electrode 1306 and a selectively conductive layer 1308 comprising an organic layer (e.g., PPA) and at least one passive layer (e.g., CuS).

In the first off state 1301, a positive charge 1310 collects in the selectively conductive layer 1308 near the bottom electrode 1306. In the on state 1302, the positive charge 1310 is uniformly distributed thereby indicating an on state. In the second off state 1303, the positive charge collects in the selectively conductive layer 1308 near the top electrode 1304.

Figure 14:
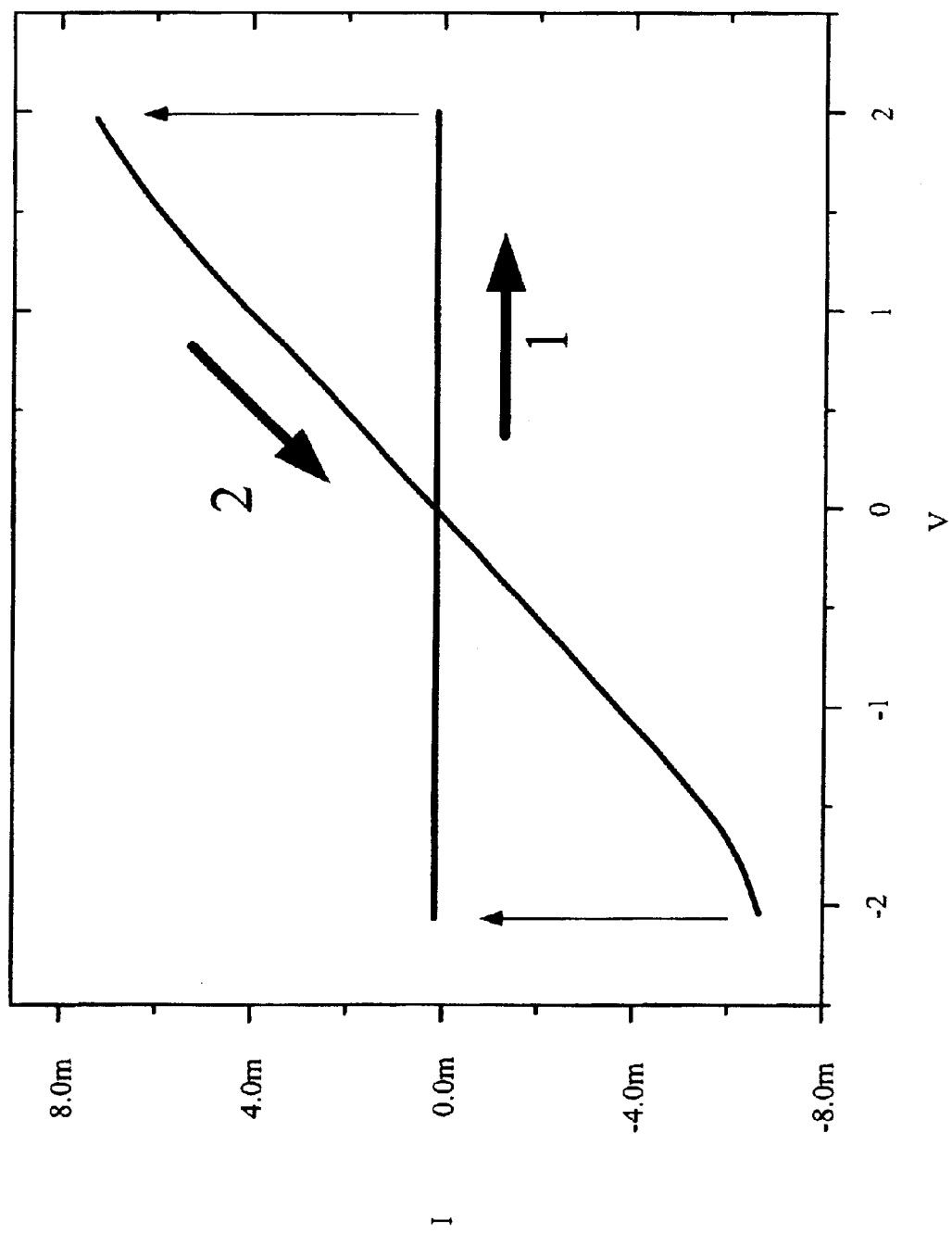
FIG. 14 is a graph illustrating I-V characteristics for an organic memory device in accordance with an aspect of the present invention.

FIG. 14 is a graph 1400 that illustrates I–V characteristics for the memory device 1300 described with respect to FIG. 13. It can be seen that from state 1, which indicates "off", the device can be modified to be in state 2, which indicates "on", by applying a positive voltage of 2V. Additionally, it can be seen that whilst in state 1, the organic memory device has a high impedance and low conductance. Subsequently, the device 1300 can be modified to change from state 2 to state 1 by application of a negative voltage, therein causing a reverse current until the state 1 is obtained.

Figure 15:
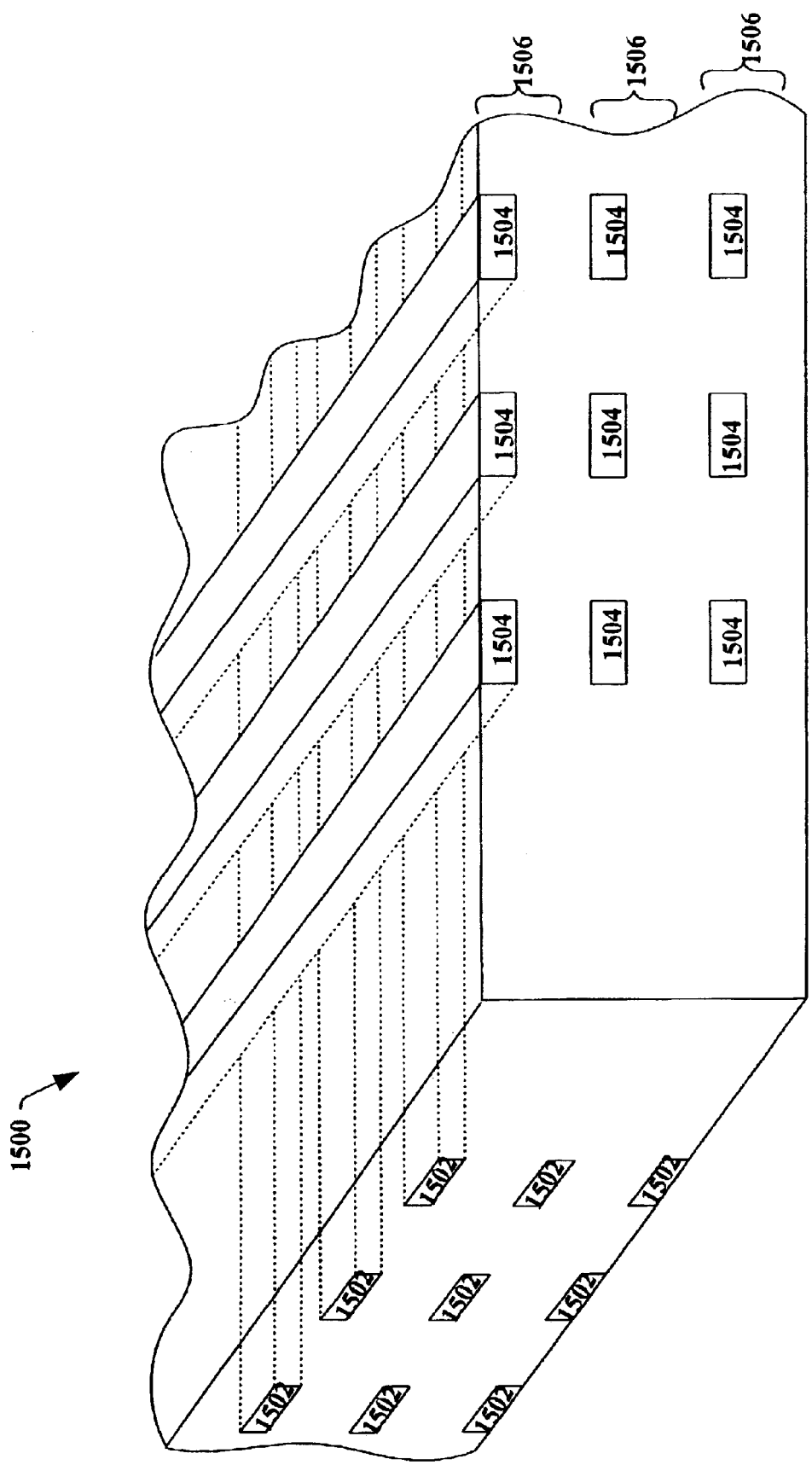
FIG. 15 is a three dimensional view of an organic memory device in accordance with an aspect of the present invention.

Referring to FIG. 15, a three dimensional view of an organic memory device 1500 containing a plurality of organic memory cells in accordance with an aspect of the invention is shown. The organic memory device 1500 contains a plurality of first electrodes 1502, a plurality of second electrodes 1504, and a plurality of memory cell layers 1506. Between the respective first and second electrodes are the controllably conductive media (not shown). The plurality of first electrodes 1502 and the plurality of second electrodes 1504 are shown in substantially perpendicular orientation, although other orientations are possible. The three dimensional microelectronic organic memory device is capable of containing an extremely high number of memory cells thereby improving device density. Peripheral circuitry and devices are not shown for brevity.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Figure 16:
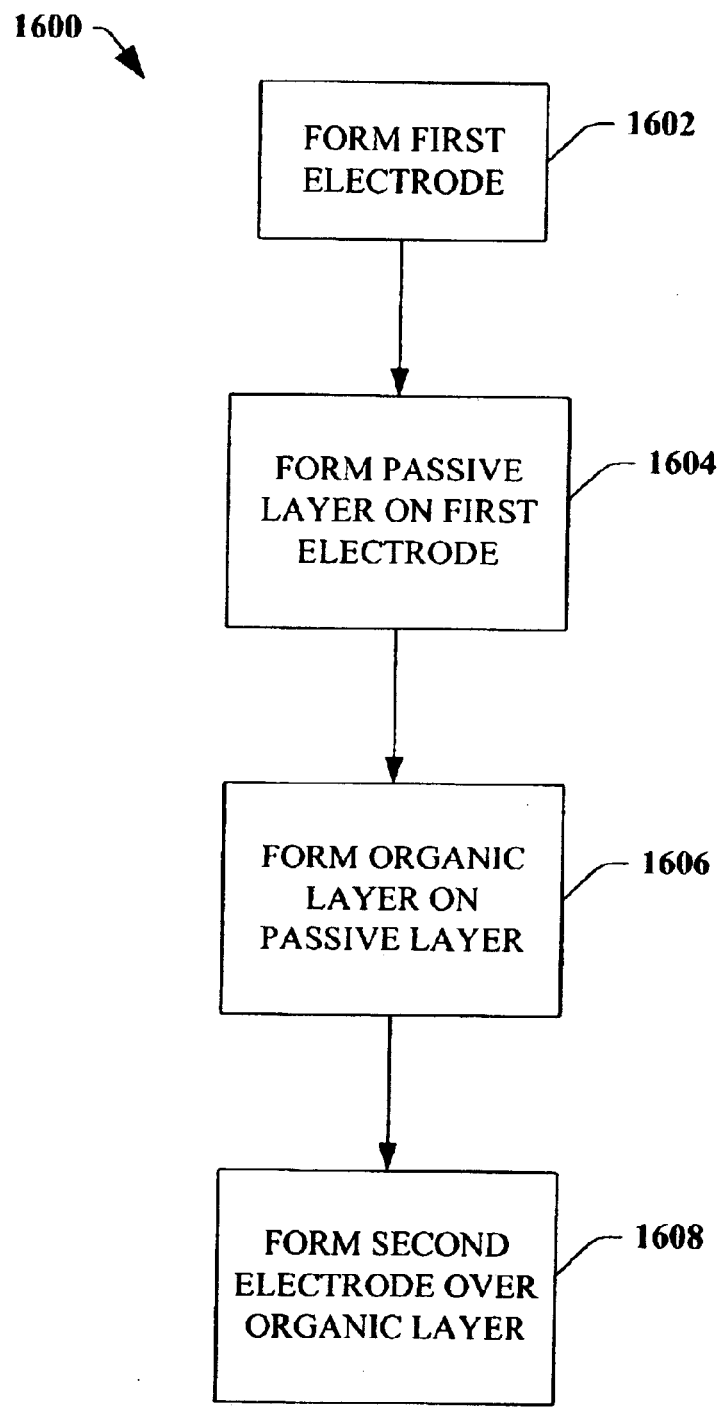
FIG. 16 is a flow diagram illustrating a method of fabricating an organic memory device in accordance with an aspect of the present invention.
Figure 17:
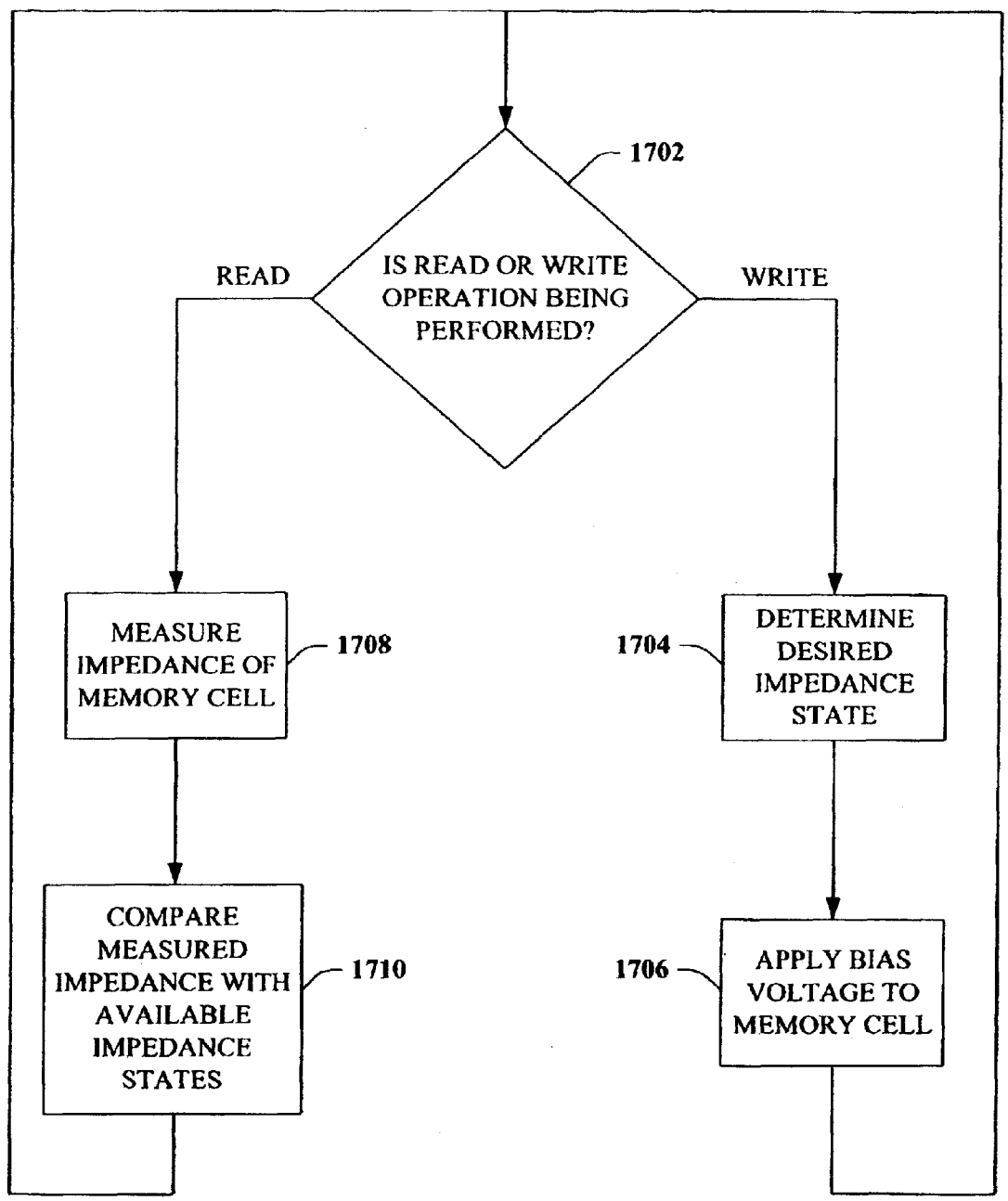
FIG. 17 is a flow diagram depicting a method of operating an organic memory device in accordance with an aspect of the present invention.

In view of the foregoing structural and functional features described above, methodologies in accordance with various aspects of the present invention will be better appreciated with reference to FIGS. 16–17. While, for purposes of simplicity of explanation, the methodologies of FIGS. 16–17 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 16 illustrates a flow diagram of a method 1600 of fabricating an organic memory device in accordance with an aspect of the invention.

A first electrode is formed on a substrate at 1602. The first electrode is comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovarg®, Invar, Monel®, Inconel®, brass, stainless steel, magnesium-silver alloy, and various other alloys. The thickness of the first electrode can vary depending on the implementation and the memory device being constructed. However, some exemplary thickness ranges include about 0.01 μm or more and about 10 μm or less, about 0.05 μm or more and about 5 μm or less, and/or about 0.1 μm or more and about 1 μm or less.

After forming the first electrode, a passive layer is formed on the first electrode layer at 1604. The passive layer contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer. The particular conductivity facilitating compound employed is selected so that the two relatively stable states match with the two relatively stable states of the conjugated organic polymer of the organic polymer layer.

The passive layer can, in some instances, act as a catalyst for forming the organic layer requiring the passive layer to be formed before the organic layer. In this connection, the backbone of the conjugated organic molecule may initially form adjacent the passive layer, and grow or assemble away and substantially perpendicular to the passive layer surface. As a result, the backbones of the conjugated organic molecules are self aligned in a direction that traverses the two electrodes.

Examples of conductivity facilitating compounds that may make up the passive layer include one or more of the following: copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$, AgS), gold sulfide ($Au_2S$, AuS), , iron oxide ($Fe_3O_4$), and the like. The passive layer 106 is typically grown using oxidation techniques, formed via gas phase reactions, or deposited between the electrodes.

The passive layer has a suitable thickness that can vary according to the implementation and/or memory device being fabricated. Some examples of suitable thicknesses for the passive layer are as follows: a thickness of about 2 Å or more and about 0.1 μm or less, a thickness of about 10 Å or more and about 0.01 μm or less, and a thickness of about 50 Å or more and about 0.005 μm or less.

Next, an organic layer is formed on the passive layer at 1606. The organic layer comprises a conjugated molecule (s). The organic polymer layer is comprised of a conjugated organic polymer. Such conjugated molecules are characterized in that they have overlapping π orbitals and that they can assume two or more resonant structures. The organic molecules may be cyclic or acyclic. During formation or deposition, the organic molecule may self assemble between the electrodes. Examples of conjugated organic materials include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the polymer can be modified by doping with a suitable dopant (e.g., salt).

The organic layer is formed with a suitable thickness that depends upon the chosen implementations and/or the memory device being fabricated. Some suitable exemplary ranges of thickness for the organic layer are about 0.001 μm or more and about 5 μm or less, about 0.01 μm or more and about 2.5 μm or less, and about a thickness of about 0.05 μm or more and about 1 μm or less.

The organic layer can be formed via a number of suitable techniques, some of which are described supra. One suitable technique that can be utilized is a spin-on technique which involves depositing a mixture of the polymer/polymer precursor and a solvent, and then removing the solvent from the substrate/electrode. Another technique is chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer.

In order to facilitate operation of the organic memory device, the organic layer is generally, but not always, substantially thicker than the passive layer. As one example, the thickness of the organic layer is from about 0.1 to about 500 times greater than the thickness of the passive layer. As another example, the thickness of the organic layer is from about 25 to about 250 times greater than the thickness of the passive layer. It is appreciated that other suitable ratios can be employed in accordance with the present invention.

The organic layer and the passive layer are collectively referred to as a selectively conductive media or selectively conductive layer. The conductive properties of this media (e.g., conductive, non-conductive, semi-conductive) are modified, in a controlled manner, by applying various voltages (e.g., bias voltages) across the media.

Finally, a second electrode is formed over the organic layer at 1608. The second electrode is formed of a conductive material in a manner similar to that of the first electrode. The second electrode can, but is not required to, be formed of the same conductive material as the first electrode.

Turning now to FIG. 17, a flow diagram of a method 1700 of operating an organic memory device in accordance with the present invention is depicted. The method 1700 can be employed to operate an organic memory device, such as that described with respect to FIG. 16. The operation of the device includes reading and writing information to and from the organic memory device. It is appreciated that the method 1700 can operated on memory cells and arrays of memory cells within the organic memory device.

The method 1700 begins at 1702 where a determination is made as to whether a read or a write operation is to be performed. For a determination of a write operation at 1702, a desired impedance state is determined at 1704. The impedance state corresponds to a desired state value and/or desired information content for respective cell(s) (e.g., 0, 1, 11, 10, and the like). The desired state is one of a plurality of available reference states or impedance levels for the device, where the available reference states indicate different information content. A bias voltage is then applied to the cell at 1706 in order to write the desired state. The method 1700 then returns to 1702 where a determination is made for a subsequent operation.

The desired information content is typically stored in the organic memory device at addressable memory locations (e.g., cells) in a specified number of bytes. However, unlike conventional memory devices, more than one bit of information can be written to a single memory cell, thus a byte of information can be stored into less than 8 memory cells.

On the determination of a read operation at 1702, the method 1700 continues at 1708 where an injection current or voltage is applied in order to measure impedance of the memory cell(s). It is appreciated that alternate aspects of the invention can read the memory cell(s) by light emission. The measured impedance is then compared with the available reference impedance states in order to determine the impedance state at 1710 in order to obtain the information content. As described supra, the impedance state corresponds to a desired state value of a particular cell (e.g., 0, 1, 11, 10, and the like) and can thus provide one or more bits of information. The impedance state is one of the available reference states for the memory cell(s), described supra.

As discussed supra, the desired information content is typically stored in the organic memory device at addressable memory locations (e.g., cells) in a specified number of bytes. However, unlike conventional memory devices, more than one bit of information can be read from a single memory cell.

It is appreciated that the above description of the method 1700 has been somewhat simplified in order to facilitate understanding of the present invention. For example, cells of the memory device are accessed via an addressing scheme in order to read and write memory locations. Additionally, the memory cell(s) can be erased (e.g., set to a default state) by applying an appropriate voltage across the selectively conductive media of the memory device. The default state is generally a very highly conductive or very low conductive impedance state.

What have been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. An organic memory device comprising:
   a first electrode;
   a selectively conductive media formed on the first electrode, the selectively conductive media facilitating migration of charge, the selectively conductive media comprising an organic material, and the charge comprising at least one of electrons and holes; and
   a second electrode, wherein a selected voltage is applied to the first electrode and the second electrode in order to set an impedance state of the selectively conductive media;
   wherein in a first state a positive charge in the selectively conductive media is collected near the first electrode, in a second state the positive charge is distributed uniformly in the selectively conductive media, and in a third state the positive charge in the selectively conductive media is collected near the second electrode.

2. The device of claim 1, the selected voltage being one of a number of voltages that corresponds to the resulting impedance state.

3. The device of claim 1, the impedance state being one of a number of available impedance states.

4. The device of claim 3, the number of available impedance states corresponding to respective information content.

5. The device of claim 1, the impedance state representing more than one bit of information.

6. The device of claim 1, wherein an injection current is applied to the first electrode and the second electrode to read a current state of the organic memory device.

7. The device of claim 6, the current state being one of a number of available states.

8. The device of claim 7, the available states representing one or more bits of information.

9. The device of claim 1, the selectively conductive media comprising a passive layer formed on the first electrode and an organic polymer layer formed on the passive layer.

10. The device of claim 9, the passive layer comprising a plurality of individual passive layers.

11. The device of claim 9, the passive layer contains $Cu_yS$.

12. The device of claim 9, the organic layer being a conjugated organic material.

13. The device of claim 9, the organic layer being selected from the group comprising: polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polystiroles.

14. The device of claim 9, the organic layer having a thickness of about 0.001 μm or more and about 5 μm or less.

15. The device of claim 9, a thickness of the organic layer is about 1 to 500 times greater than a thickness of the passive layer.

16. The device of claim 1, the first electrode comprising a material being selected from the group comprising aluminum, chromium, copper, germanium, gold, magnesium, manganese, indium, iron, nickel, palladium, platinum, silver, titanium, zinc, alloys thereof, indium-tin oxide, polysilicon, doped amorphous silicon, and metal silicides.

17. The device of claim 1, thicknesses of the first electrode and the second electrode being about 0.01 $\mu$m or more and about 10 $\mu$m or less.

18. A method of fabricating an organic memory device comprising:

forming a first electrode on a substrate;

forming a selectively conductive media on the first electrode, the selectively conductive media includes a passive layer and an organic layer, the organic layer being substantially thicker than the passive layer; and forming a second electrode on the selectively conductive media;

wherein the selectively conductive media facilitates migration of a charge wherein in a first state a positive charge of the selectively conductive media is accumulated near the first electron, in a second state the positive charge is dispersed in the selective conductive media, and in a third state the positive charge is accumulated near the second electrode.

19. The method of claim 18, the organic layer formed via a chemical vapor deposition process.

20. The method of claim 18, the organic layer formed via a gas phase reaction process.

21. The method of claim 18, the organic layer formed via a spin coating process.

22. The method of claim 18, further comprising applying a first voltage to the first electrode and the second electrode to set an impedance state of the memory device, the impedance state representing information content.

23. The method of claim 18, further comprising applying a second voltage to the first electrode and the second electrode to determine an impedance state of the memory device, the impedance state representing information content.

* * * * *